United States Patent [19]

Hyung et al.

[11] Patent Number: 5,523,255
[45] Date of Patent: Jun. 4, 1996

[54] METHOD FOR FORMING A DEVICE ISOLATION FILM OF A SEMICONDUCTOR DEVICE

[75] Inventors: Yong-woo Hyung; Don-young Ku, both of Suwon; Byung-hong Chung; Yong-oon Hwang, both of Seoul; Hung-mo Yang, Suwon; Yun-seung Shin, Seoul, all of Rep. of Korea

[73] Assignee: Samsung Electronics Co., Ltd., Suwon, Rep. of Korea

[21] Appl. No.: 455,646

[22] Filed: May 31, 1995

[30] Foreign Application Priority Data

May 31, 1994 [KR] Rep. of Korea ............... 94-12153
Oct. 27, 1994 [KR] Rep. of Korea ............... 94-27704

[51] Int. Cl.$^6$ .................................................. H01L 21/76
[52] U.S. Cl. ........................... 437/69; 437/70; 437/968
[58] Field of Search ........................... 437/69, 70, 968

[56] References Cited

U.S. PATENT DOCUMENTS 5,260,229  11/1993  Hodges et al. ..................... 437/69
5,358,893  10/1994  Yang et al. ........................ 437/70
5,447,885   9/1995  Cho et al. .......................... 437/69

FOREIGN PATENT DOCUMENTS 0144542  6/1988  Japan.

Primary Examiner—Brian E. Hearn
Assistant Examiner—Trung Dang
Attorney, Agent, or Firm—Cushman, Darby & Cushman

[57] ABSTRACT

A method for forming a device isolation film of a semiconductor device, which includes the steps of forming a pad oxide film on a semiconductor substrate, forming an oxidation buffer layer on the pad oxide film, forming an oxidation prevention film on the oxidation buffer layer, forming an aperture in the oxidation prevention film and a longitudinally co-extensive recess in the oxidation buffer layer, to thereby expose a portion of the oxidation buffer layer, forming a cap oxide film on the exposed portion of the oxidation buffer layer by subjecting a first resultant structure obtained by the preceding steps to a thermal oxidation process, forming an oxynitride film at an interface between the cap oxide film and the oxidation buffer layer by heat-treating a second resultant structure obtained by the preceding steps in a nitrogen atmosphere, and, forming the device isolation film by subjecting a third resultant structure obtained by the preceding steps to a thermal oxidation process.

20 Claims, 5 Drawing Sheets

METHOD FOR FORMING A DEVICE ISOLATION FILM OF A SEMICONDUCTOR DEVICE

BACKGROUND OF THE INVENTION

The present invention relates generally to a method for manufacturing a semiconductor device, and, more particularly, to a method for forming a device isolation film of a sub-micron scale semiconductor device.

Current semiconductor devices have attained such high integration densities that the dimensions of the device isolation regions thereof have shrunk to a sub-micron level. In such high-density semiconductor devices, a bird's beak is generated when a device isolation film is formed using a local oxidation of silicon (LOCOS) method for forming a semi-recessed field oxide film. Accordingly, device isolation is exceedingly difficult to achieve at sub-micron device geometries. Therefore, a selective polysilicon oxidation (SEPOX) method has been proposed to overcome the shortcomings and limitations of the LOCOS method.

With reference to FIGS. 1A and 1B, a typical SEPOX method will now be described. First, with reference to FIG. 1A, a thin pad oxide film 12 is formed on a semiconductor substrate 10 using a thermal oxidation process. Then, polysilicon and nitride are sequentially deposited on the pad oxide film 12, to thereby form a buffer silicon film 14 and an oxidation prevention film 16. Then, using a standard photolithographic etching process, the oxidation prevention film 16 and the buffer silicon film 14 are partially etched, to thereby form an aperture 18 in the region where a field oxide film is to be subsequently formed.

Next, with reference to FIG. 1B, using a thermal oxidation process, the exposed surfaces of the buffer silicon film 14 and the substrate 10 are selectively oxidized, to thereby form a device isolation film 20.

In accordance with the above-described SEPOX method, oxidation stresses generated in the semiconductor substrate when the device isolation film is formed are decreased, and the size of the bird's beak is reduced. However, the SEPOX method still has drawbacks. Most importantly, a bird's beak occurs at two places when the geometries of the active regions of the device fall to low sub-micron levels, effectively limiting the achievable minimum geometries of the device. More particularly, a lower bird's beak is generated between the pad oxide film 12 and the semiconductor substrate 10, as expected, but, additionally, an upper bird's beak (labelled "A" in FIG. 1B) is generated between the oxidation prevention film 16 and the buffer silicon film 14. The lower bird's beak effectively reduces the size of the active region, and the upper bird's beak degrades the reliability of the device.

These methods are not applicable to the manufacture of 64Mb and 256Mb DRAMs, since they cannot achieve isolation regions of less than about 0.5 μm. To overcome this limitation, a high-temperature heat treatment process is performed in a nitrogen atmosphere at a temperature of 1,150° C., immediately after depositing the oxidation prevention film 16. However, this technique also presents several problems, as discussed below.

First, with extended exposure to such high temperatures, a silicon wafer tends to warp, and, in subsequent photolithographic steps, misalignment problems arise. Thus, the wafer warpage problem impedes mass production of DRAMs having a memory capacity of 64Mb or higher.

Second, nitrogen reacts with the buffer silicon film, to thereby cause nitrogen pitting on the surface of the wafer when the high-temperature heat treatment process is performed.

Third, thermal stress is generated due to a difference in the thermal expansion coefficients of the various layers which are deposited on the silicon substrate, thereby causing dislocation defects in the substrate when the high-temperature heat treatment is performed.

The generation of the lower bird's beak can be suppressed by decreasing the thickness of the pad oxide film 12 while increasing the thickness of the buffer silicon film 14. However, the generation of the upper bird's beak ("A") cannot be suppressed by varying the thickness of the pad oxide film 12 and the buffer silicon film 14.

In addition, when the upper bird's beak becomes large enough, a residue of the buffer silicon film 14 remains between the upper and lower bird's beaks, even when the oxidation prevention film 16 and the buffer silicon film 14 are removed after formation of the device isolation film 20.

To overcome the problem of an upper bird's beak which is generated when a device isolation film 20 is formed by the SEPOX method, the following two methods have been proposed. In accordance with the first method, a native oxide film formed on the buffer silicon film 14 is converted into an oxynitride film by performing an NH$_3$ treatment after depositing the buffer silicon film 14. In accordance with the second method, a coupling reaction between the buffer silicon film 14 and the oxidation prevention film is activated by performing an N$_2$ ion-implantation step after depositing the oxidation prevention film 16.

Fourth, if, after the buffer silicon film formation step, the manufacturing process is delayed for any reason, a native oxide film grows beyond a tolerable thickness, e.g., 15 angstroms. If the native oxide film reaches such a thickness, it becomes exceedingly difficult, if not impossible, to suppress the generation of the upper bird's beak.

Accordingly, there presently exists a need for a method for forming a device isolation film which enables reduction of an upper bird's beak without warping the wafer, and which generally overcomes the above discussed drawbacks and shortcomings of the presently available technology. The present invention fulfills this need.

SUMMARY OF THE INVENTION

In a first preferred embodiment, the present invention encompasses a method for forming a device isolation film of a semiconductor device, which includes the steps of (a) forming a pad oxide film on a semiconductor substrate, (b) forming an oxidation buffer layer on the pad oxide film, (c) forming an oxidation prevention film on the oxidation buffer layer, (d) forming an aperture in the oxidation prevention film and a longitudinally co-extensive recess in the oxidation buffer layer, to thereby expose a portion of the oxidation buffer layer, (e) forming a cap oxide film on the exposed portion of the oxidation buffer layer by subjecting a first resultant structure obtained by the preceding steps to a thermal oxidation process, (f) forming an oxynitride film at an interface between the cap oxide film and the oxidation buffer layer by heat-treating a second resultant structure obtained by the preceding steps in a nitrogen atmosphere, and, (g) forming the device isolation film by subjecting a third resultant structure obtained by the preceding steps to a thermal oxidation process.

Preferably, the steps (e), (f), and (g) are performed by an in-situ process. In addition, the oxynitride film is preferably further formed at an interface of the oxidation prevention film and the oxidation buffer layer during the step (f).

It is desirable that the cap oxide film be formed to a thickness below 300 angstroms and that the oxynitride film be formed to a thickness below 30 angstroms.

It is desirable that the step (f) be performed at a temperature above 1,100° C.

In a second preferred embodiment, the present invention encompasses a method for forming a device isolation film of a semiconductor device, which includes the steps of (a) forming a pad oxide film on a semiconductor substrate, (b) forming an oxidation buffer layer on the pad oxide film, (c) forming a first oxidation prevention film on the oxidation buffer layer, (d) heat-treating a first resultant structure obtained by the preceding steps, (e) forming a second oxidation prevention film on the first oxidation prevention film, (f) forming a longitudinally co-extensive aperture in the first and second oxidation prevention films, and, (g) forming the device isolation film by subjecting a second resultant structure obtained by the preceding steps to a thermal oxidation process.

It is desirable that the pad oxide film be formed to a thickness of 110–500 angstroms, and that the oxidation buffer layer be formed to a thickness of 500–2,000 angstroms.

It is further desirable that a process for nitrifying a native oxide film formed on the oxidation buffer layer, using a nitrogen gas, be added to the step (b). Preferably, the nitrogen gas employed is $NH_x$.

It is also desirable that the oxidation buffer layer be formed of polysilicon, and that the first and second oxidation prevention films be formed of silicon nitride.

It is preferable that the first oxidation prevention film be formed to a thickness of 100–500 angstroms, and most preferably, to a thickness of 200 angstroms. It is also preferable that the total thickness of the first and second oxidation prevention films be 1,000–3,000 angstroms.

It is desirable that the step (d) be performed in a nitrogen atmosphere, preferably at a temperature of 1,050° C.–1,150° C., for 1–4 hours, and most preferably, at a temperature of 1,150° C., for about eight hours.

In accordance with both the first and second preferred embodiments of the method of the present invention, a device isolation film can be obtained which prevents nitrogen pitting and substrate dislocation, and which reduces wafer warpage and an upper bird's beak.

BRIEF DESCRIPTION OF THE DRAWINGS

These and various other objects, features, and advantages of the present invention will be readily understood with reference to the following detailed description taken in conjunction with the accompanying drawings, in which.

DETAILED DESCRIPTION OF THE INVENTION

Figure 1A:
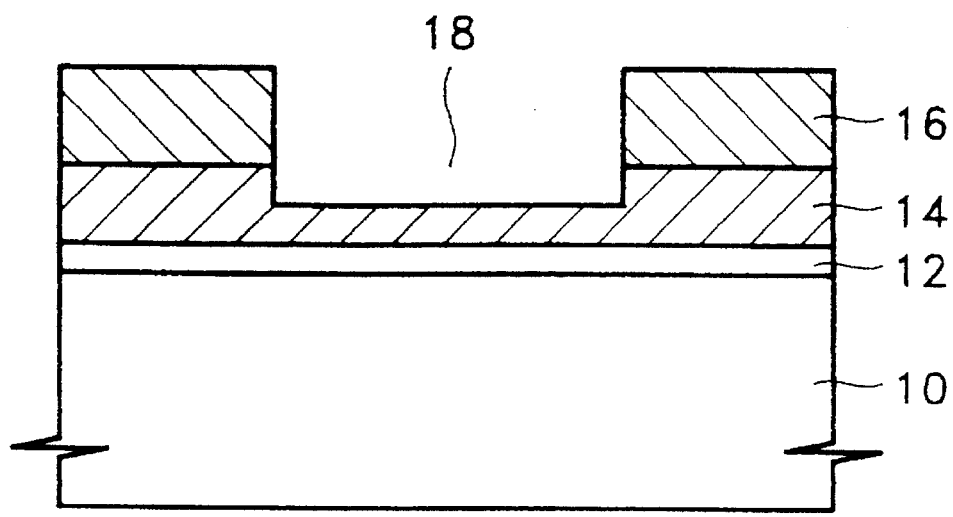
FIGS. 1A–1B are cross-sectional views depicting successive steps of a conventional SEPOX method.
Figure 1B:
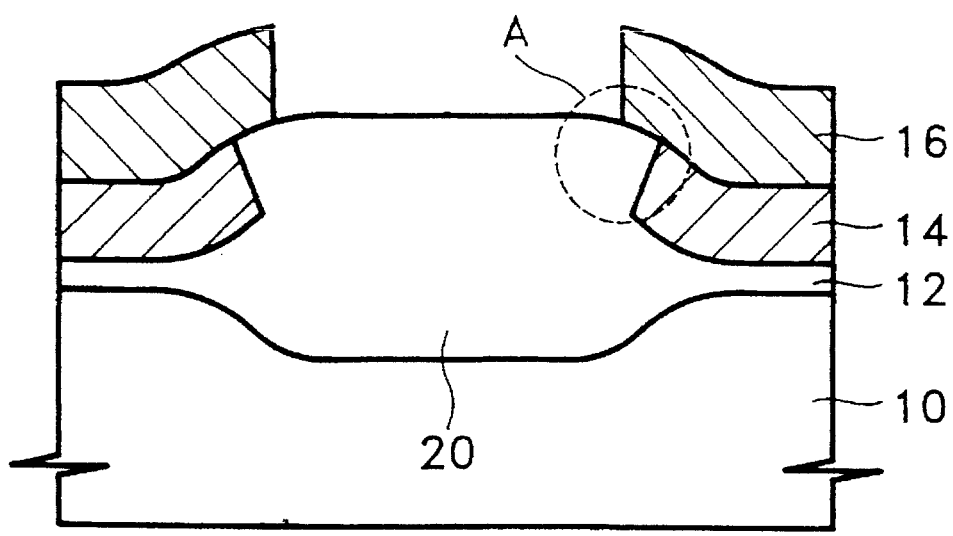
Figure 2A:
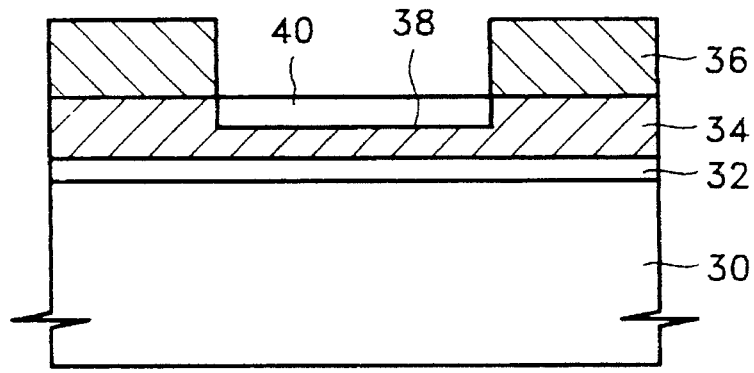
FIGS. 2A–2C are cross-section views depicting successive steps of a method for forming a device isolation film in accordance with a first preferred embodiment of the present invention.
Figure 2B:
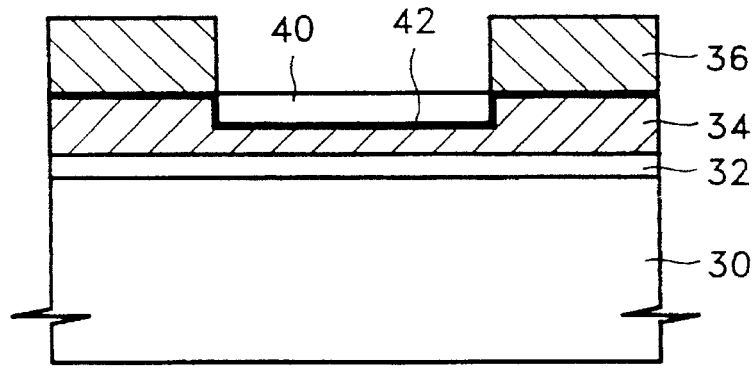
Figure 2C:
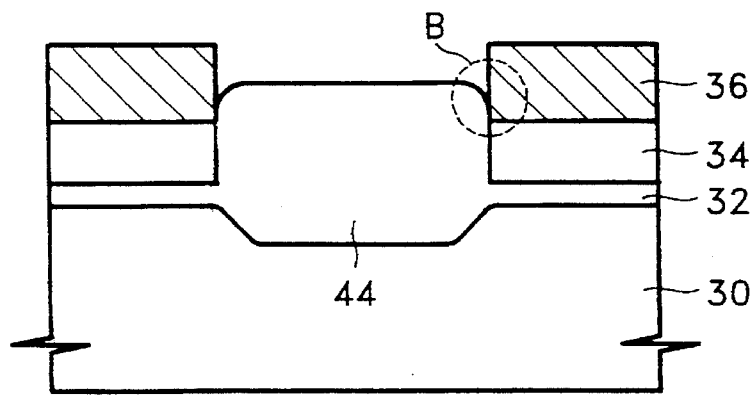

With reference now to FIGS. 2A–2C, a method for forming a device isolation film in accordance with a first preferred embodiment of the present invention will now be described.

With reference now to FIG. 2A, a pad oxide film 32 is formed on a semiconductor substrate 30, preferably by using a thermal oxidation process. Next, an oxidation buffer layer 34 is formed on the pad oxide film 32. Then, an oxidation prevention film 36 is formed on the oxidation buffer layer 34. Next, an aperture 38 and a longitudinally co-extensive recess are formed in the oxidation prevention film 36 and the oxidation buffer layer 34, respectively, to thereby expose a portion of the oxidation buffer layer 34. The resultant structure is then subjected to a thermal oxidation process, to thereby form a cap oxide film 40 on the exposed portion of the oxidation buffer layer 34.

The oxidation buffer layer 34 is preferably formed by depositing polysilicon on the pad oxide layer 32, which reduces physical stresses generated in the substrate due to volume expansion generated during a subsequent process for forming a device isolation film.

The oxidation prevention film 36 is preferably formed by depositing silicon nitride on the oxidation buffer layer 34. It is desirable that the oxidation prevention film 36 be formed to a thickness that minimizes the bird's beak and minimizes the generation of stresses.

The cap oxide film 40 is preferably formed to a thickness of 300 angstroms or less, which prevents nitrogen pitting caused by a reaction between nitrogen and the silicon at the surface of the wafer when a subsequent high-temperature process is performed in a nitrogen atmosphere.

With reference now to FIG. 2B, the resultant structure depicted in FIG. 2A is heat-treated in a nitrogen atmosphere, at a high temperature, e.g., at 1,100° C., to thereby form a oxynitride film 42 to a thickness of 30 angstroms or less, at an interface between the cap oxide film 40 and the oxidation buffer layer 34, and, preferably, also at an interface between the oxidation prevention film 36 and the oxidation buffer layer 34.

In general, if the oxidation buffer layer 34 is exposed to the ambient atmosphere, a native oxide film having a thickness of 10–100 angstroms grows thereon. The native oxide film has an oxygen diffusion speed which is greater than that of a polysilicon film or a silicon nitride film. Therefore, the native oxide film increases the size of an upper bird's beak.

When heat treatment is performed at a temperature of above 1,100° C. in a nitrogen atmosphere, the native oxide film on the oxidation buffer layer 34 is nitrated, thereby forming the oxynitride film 42 at an interface between the oxidation buffer layer 34 and the oxidation invention film 36. The oxygen diffusion speed of the oxynitride film 42 is similar to that of a silicon nitride film. Accordingly, the effective oxygen diffusion speed is decreased, to thereby prevent oxygen from being diffused through the boundary surface between the oxidation prevention film 36 and the oxidation buffer layer 34. As a result, the generation of an upper bird's beak is suppressed.

In addition, since the above-described high temperature heat-treating process is performed after the oxidation prevention film 36 is patterned, the stresses caused by the heat treatment process are dispersed, and thus reduced, due to presence of islets of the oxidation prevention film 36. Accordingly, wafer warpage and dislocation defects are prevented.

With reference now to FIG. 2C, a device isolation film 44 is formed by performing a thermal oxidation process on the resultant structure depicted in FIG. 2B. As shown in FIG. 2C, an upper bird's beak (labelled "B") at an interface between the oxidation prevention film 36 and the oxidation buffer layer 34 is almost entirely suppressed by the oxynitride film 42.

In this first preferred embodiment of the present invention, the cap oxide film 40, the oxynitride film 42, and the device isolation film 44 are preferably formed by an in-situ process.

Figure 3:
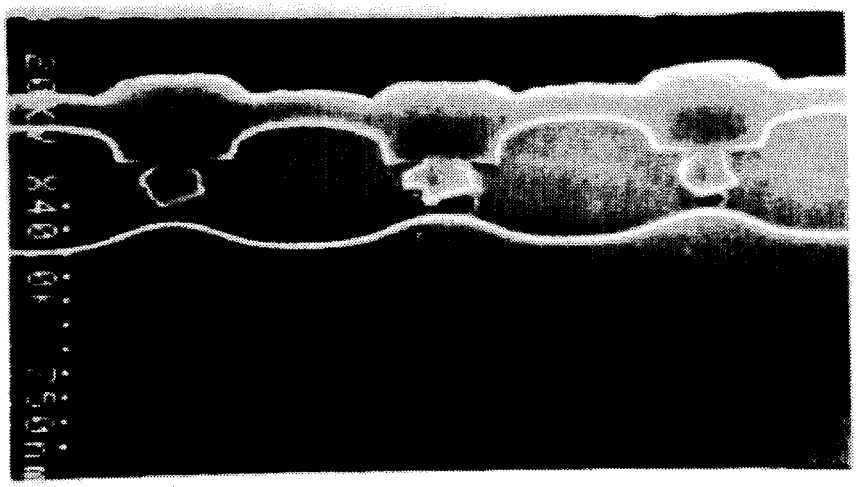
FIG. 3 is a scanning electron microscopy (SEM) photograph illustrating a device isolation film formed by a conventional method in which a high temperature heat-treating process is performed after an oxidation prevention film is formed.

FIG. 3 is an SEM photograph depicting a device isolation film formed by a conventional method in which a high temperature heat-treating process is performed after an oxidation prevention film is formed, and illustrates the characteristics of the device isolation film when applied to a 64 Mb DRAM. As shown in FIG. 3, the pitch of the isolation region is limited to 0.42 μm, which is not sufficiently fine for 256Mb DRAMs.

Figure 4A:
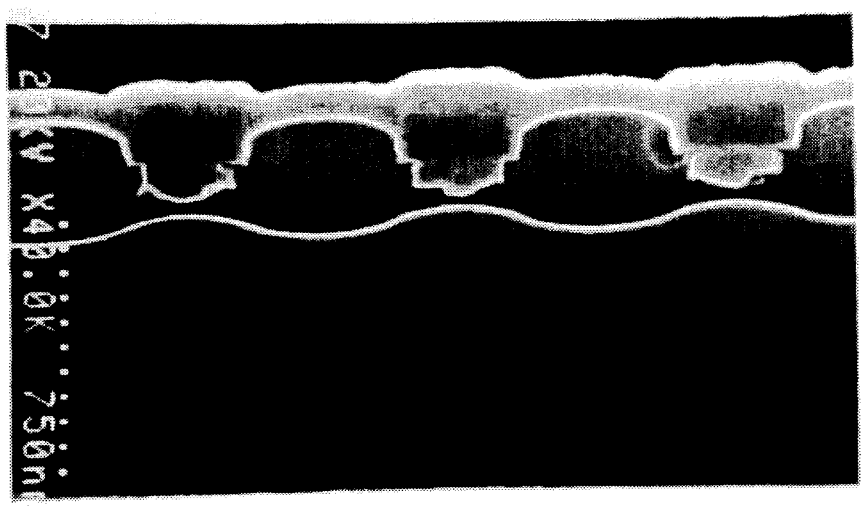
FIGS. 4A–4B are SEM photographs illustrating a device isolation film formed by the method of the first preferred embodiment of the present invention; and, FIGS. 5A–5E are cross-sectional views depicting successive steps of a method for forming a device isolation film in accordance with a second preferred embodiment of the present invention.
Figure 4B:
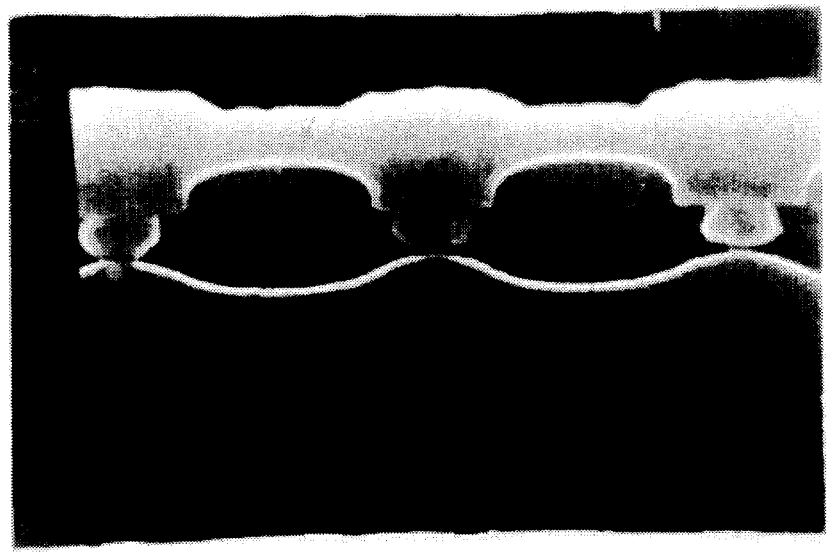

FIGS. 4A & 4B are SEM photographs depicting a device isolation film formed by the above-described first preferred embodiment of the present invention. FIG. 4A illustrates the device isolation film applied to a 64Mb DRAM, and FIG. 4B illustrates the device isolation film applied to a 256Mb DRAM. When applied to 64Mb DRAMs (FIG. 4A), the isolating region of the device isolation film of the present invention has a pitch limit of 0.4 μm, and when applied to 256 Mb DRAMs (FIG. 4B), the isolating region of the device isolation film of the present invention has a pitch limit of 0.27 μm. Accordingly, using this embodiment of the present invention, adequate device isolation can be achieved for integration levels as high as that required for 256 Mb DRAMs.

The above-described first preferred embodiment of the present invention has the following merits.

First, a capping oxide film is formed on an oxidation buffer layer and prevents nitrogen pitting of the surface of the wafer when a high-temperature heat-treating process is performed in a nitrogen atmosphere.

Second, an oxynitride film grows at an interface between the capping oxide film and an oxidation buffer layer after the oxidation prevention film and an oxidation buffer layer are patterned. Thus, a phenomenon where oxygen is diffused between the oxidation buffer layer and the oxidation prevention film is prevented, to thereby suppress the generation of an upper bird's beak.

Third, since the heat treatment process is performed after the oxidation prevention film is patterned, the physical stresses generated in the substrate due to the high temperature process are dispersed, and thus reduced, due to the presence of the islets of the oxidation prevention film. Accordingly, wafer warpage and substrate dislocation is prevented, which enables mass production of 64 Mb and 256 Mb DRAMs.

With reference now to FIGS. 5A–5E, a method for forming a device isolation film in accordance with a second preferred embodiment of the present invention will now be described.

Figure 5A:
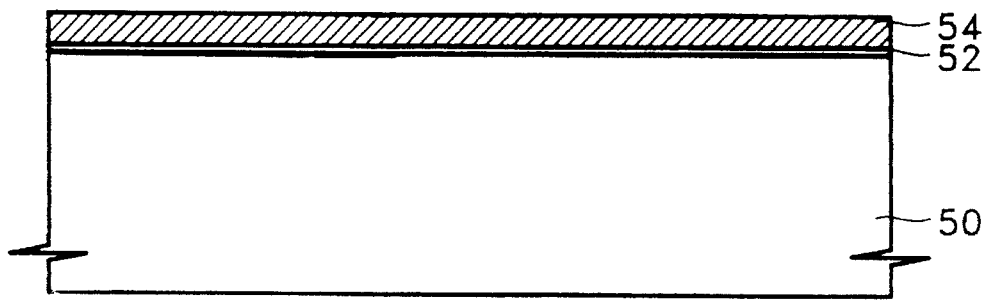

With reference now to FIG. 5A, a pad oxide film 52 is formed on a semiconductor substrate 50, and an oxidation buffer layer 54 is formed on the pad oxide film 52. Preferably, the pad oxide film 52 and the oxidation buffer layer 54 are formed to have a combined thickness sufficient to enable the relaxation of the physical stresses to which the substrate is subjected when a device isolating film is formed, and together serve as an etching blocking layer. Preferably, the pad oxide film 52 is formed to a thickness of approximately 110–500 angstroms, and, most preferably, to a thickness of 240 angstroms, by using a standard thermal oxidation process. The oxidation buffer layer 54 is preferably formed to a thickness of approximately 500–2,000 angstroms.

The oxidation buffer layer 54 is preferably formed by means of a lowpressure chemical vapor deposition (LPCVD) of a material which may or may not be impurity-doped, but which has properties similar to those of the material constituting the semiconductor substrate, e.g., polysilicon. The oxidation buffer layer 54 relaxes the physical stresses due to volume expansion which occurs when the subsequent thermal oxidization process for forming a device isolation film is performed.

When the oxidation buffer layer 54 is exposed to air, the oxygen atoms are combined with silicon atoms constituting the polysilicon, thereby growing a native oxide film (not shown) having a thickness of approximately 10–100 angstroms on the exposed surface of the oxidation buffer layer 54. In such a native oxide film, the diffusion speed of an oxidizer (i.e., oxygen) is faster than that of the polycrystalline layer itself or of a silicon nitride film. Therefore, the native oxide film increases the size of an upper bird's beak. Accordingly, it is desirable that a process for converting the native oxide film into a silicon nitride (SION) film be performed after the above-described oxidation buffer layer 54 is formed on the pad oxide film 52. The process is preferably carried out by placing the semiconductor substrate into a nitride film deposition chamber and heat-treating the surface of the substrate at a temperature of about 850° C., in an $NH_x$ atmosphere. In this way, the diffusion speed of the oxidizer in the silicon nitride film is reduced to below that of the untreated native oxide film, to thereby suppress the generation of an upper bird's beak.

Figure 5B:
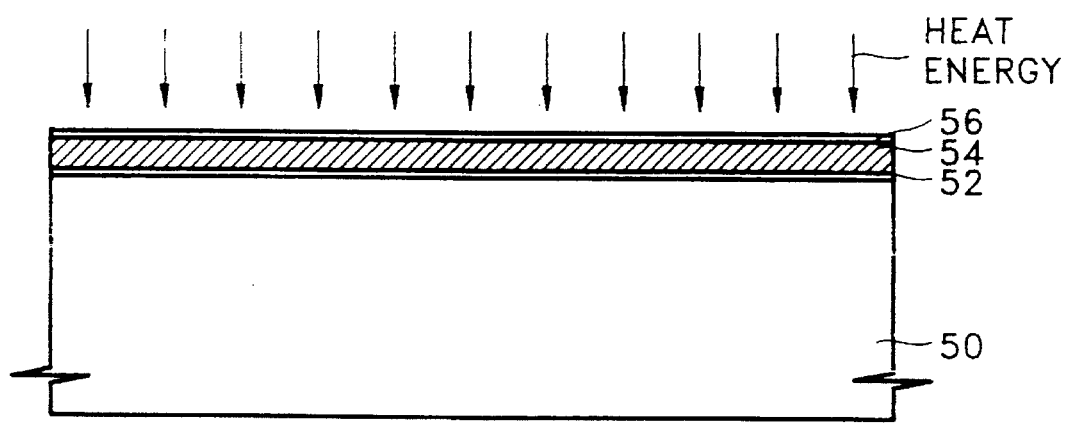

With reference now to FIG. 5B, a silicon nitride film is deposited, e.g., by using an LPCVD process, to thereby form a first oxidation prevention film 56. Next, the resultant structure is subjected to a high temperature heat treatment process.

The thickness of the first oxidation prevention film 56 should be sufficient to minimize the stresses caused by heat expansion differences between the films generated when a subsequent high temperature heat treatment process is performed, to thus minimize wafer warpage. Preferably, the first oxidation prevention film 56 is formed to a thickness of about 100–500 angstroms, and, most preferably, to a thickness of about 200 angstroms.

The above-described heat treatment process is preferably performed at a high temperature of about 1,150° C., in a nitrogen atmosphere, for about eight hours. When such heat treatment is performed, an interface between the first oxidation prevention film 40 and the oxidation buffer layer 30 is stabilized. In addition, the grain size of the polycrystalline silicon constituting the oxidation buffer layer 30 is stabilized. In addition, the grain size of the polycrystalline silicon constituting the oxidation buffer layer 30 is enlarged, and a phenomenon wherein oxidization occurs preferentially along grain interfaces is eliminated. Thus, the fundamental causes of the generation of an upper bird's beak are eliminated.

Although the above-described heat treatment step can be performed at a temperature as low as 1,050° C., it has been discovered that a marked suppression of the upper bird's beak is achieved by heat-treating at 1,150° C. for about eight hours. Further, the reduction in the upper bird's beak is sufficient to enhance device performance relative to the device performance which is achieved when the heat treatment process is carried out for just 1–4 hours at a temperature of 1,050° C.–1,150° C.

An N- or P-type well (not shown) for manufacturing a CMOS device (not shown) can be formed by injecting N- or P-type impurities into the semiconductor substrate and diffusing the injected ions by employing a thermal drive-in process, in a manner well-known in the pertinent art.

The process steps of forming the first oxidation prevention film 56 and for heat-treating the resultant structure at a high temperature are preferably carried out under process conditions very similar to the thermal drive-in process for forming a well in the substrate. Thus, in accordance with the present invention, it is possible to form a well without the necessity of an additional thermal drive-in process.

Figure 5C:
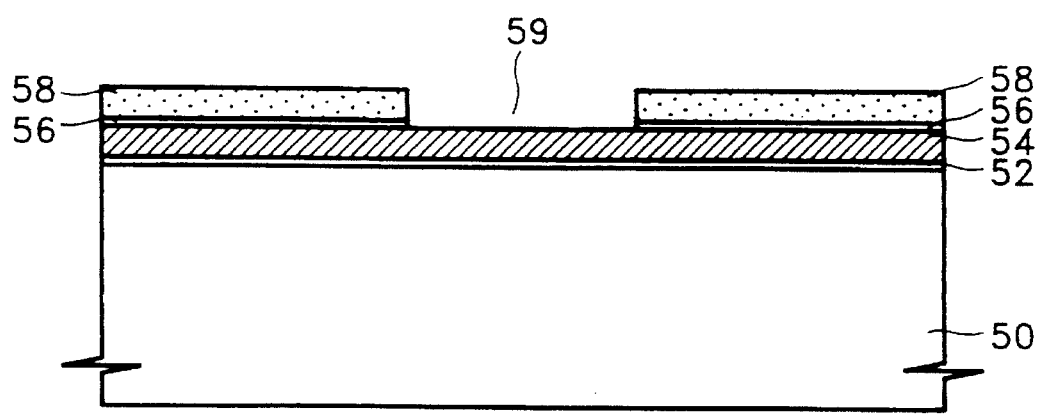

With reference now to FIG. 5C, the same material as that constituting the first oxidation prevention film 56, e.g., a silicon nitride, is deposited on the high-temperature-treated resultant structure depicted in FIG. 5B, preferably to a thickness of about 1,300 angstroms, to thereby form a second oxidation prevention film 58. Next, a longitudinally co-extensive aperture 59 is formed in the first and second oxidation prevention films 56, 58, respectively, to thereby expose a portion of the oxidation buffer layer 54.

It is desirable that the total combined thickness of the first oxidation prevention film 56 and the second oxidation prevention film 58 be approximately 1,000–3,000 angstroms, which enables the oxidation prevention films 56, 58 to serve as both an oxidation prevention layer and as an etching blocking layer. It is further desirable that the first oxidation prevention film 56 be formed to a thickness sufficient to prevent wafer warpage caused by stresses between films when high-temperature heat treatment is performed, as described above. In addition, the aperture 59 is preferably formed by a reactive ion etching (RIE) method in which a photoresist pattern (not shown) is employed as an etching mask.

Figure 5D:
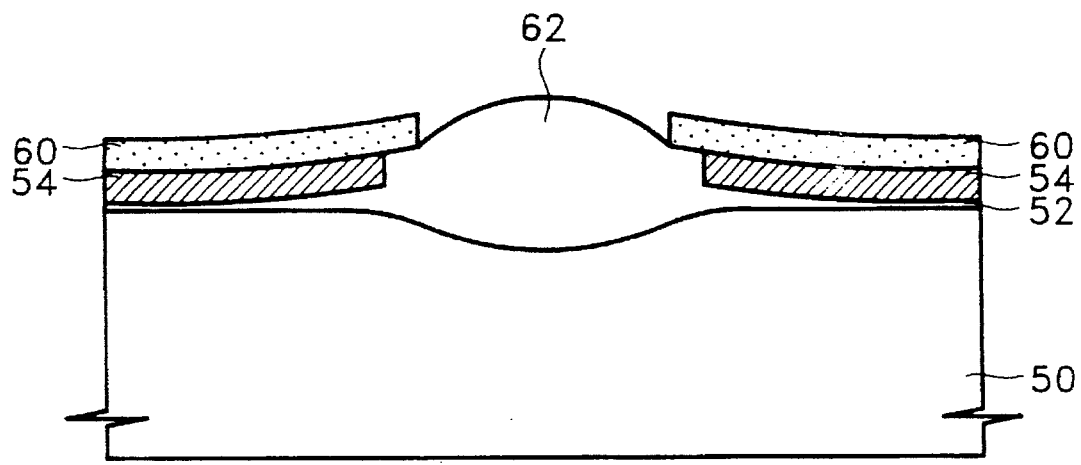

With reference now to FIG. 5D, a device isolation film 62 is formed by oxidizing the portion of the oxidation buffer layer 54 exposed by the aperture 59 and an underlying surface portion of the semiconductor substrate 50, e.g., by employing a conventional thermal oxidization process. It is desirable that the device isolation film 62 be formed to a thickness of about 4,000 angstroms. In FIG. 5D, the reference numeral 60 denotes the combined first and second oxidation prevention films 56 and 58.

Figure 5E:
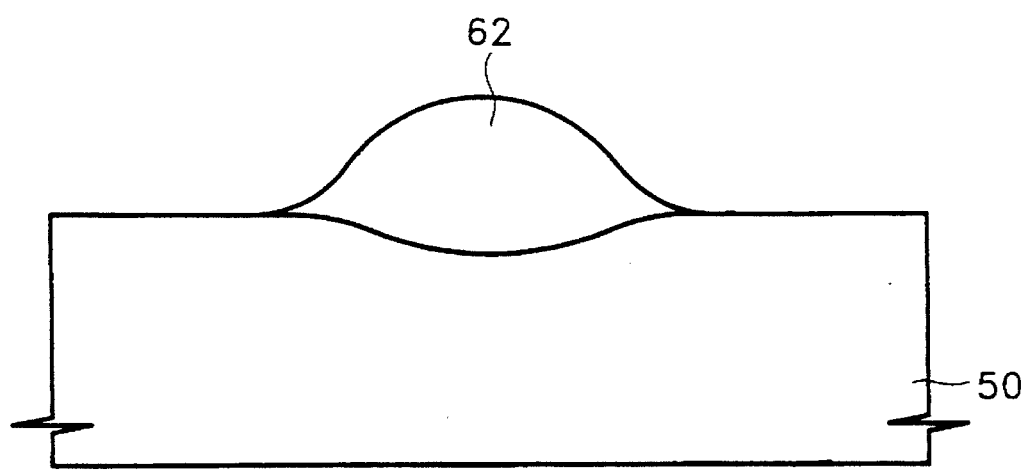

With reference now to FIG. 5E, the first and second oxidation prevention films 56, 58, respectively, and the oxidation buffer layer 54, and the unoxidized portion of the oxidation buffer layer 54, are removed. In addition, an ion implantation process for forming a channel stop layer for enhancing the electrical isolation between devices can be performed after the aperture 59 is formed (FIG. 5C), and after the device isolation film 62 is formed (FIG. 5D).

The method for forming a device isolation film in accordance with the second preferred embodiment of the present invention has the following merits.

First, an interface between an oxidation buffer layer and an oxidation prevention film is stabilized by a high-temperature heat treatment process performed after the first oxidation prevention film is formed, the grain size of the polycrystalline silicon constituting the oxidation buffer layer is enlarged, and a phenomenon in which oxidization occurs preferentially along the grain interface is eliminated. Thus, the size of the upper bird's beak is greatly reduced.

Second, wafer warpage caused by a thermal expansion difference between films when a high-temperature process is performed is minimized by forming the first oxidation prevention film sufficiently film. Accordingly, misalignment problems during a subsequent photolithographic process are prevented.

It will be appreciated by those skilled in the art that with the method of the present invention, wafer defects caused by nitrogen pitting, disclocation defects due to differences in the thermal expansion coefficients of the different layers, wafer warpage, and an upper bird's beak, are significantly reduced.

Although two separate preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A method for forming a device isolation film of a semiconductor device, comprising the steps of:

forming a pad oxide film on a semiconductor substrate;

forming an oxidation buffer layer on said pad oxide film;

forming an oxidation prevention film on said oxidation buffer layer;

forming an aperture in said oxidation prevention film and a longitudinally co-extensive recess in said oxidation buffer layer, to thereby expose a portion of said oxidation buffer layer;

forming a cap oxide film on said exposed portion of said oxidation buffer layer by subjecting a first resultant structure obtained by the preceding steps to a thermal oxidation process;

forming an oxynitride film at an interface between said cap oxide film and said oxidation buffer layer by heat-treating a second resultant structure obtained by the preceding steps in a nitrogen atmosphere; and, forming said device isolation film by subjecting a third resultant structure obtained by the preceding steps to a thermal oxidation process.

2. The method as set forth in claim 1, wherein the step of forming said cap oxide film is carried out by filling said recess in said oxidation buffer layer with an oxide material.

3. The method as set forth in claim 2, wherein the step of forming a cap oxide film is carried out in such a manner as to render an upper surface of said cap oxide film co-planar with an upper surface of Said oxidation buffer layer adjacent to said recess.

4. The method as set forth in claim 1, wherein the steps of forming a cap oxide film, forming an oxynitride film, and forming said device isolation film, are performed in-situ.

5. The method as set forth in claim 1, wherein the step of forming an oxynitride film is performed in such a manner as to additionally form said oxynitride film at an interface between said oxidation prevention film and said oxidation buffer layer.

6. The method as set forth in claim 1, wherein said cap oxide film is formed to a thickness no greater than 300 angstroms.

7. The method as set forth in claim 1, wherein the step of forming an oxynitride film is carried out at a temperature of at least 1,100° C.

8. The method as set forth in claim 1, wherein said oxynitride film is formed to a thickness of no greater than 30 angstroms.

9. The method as set forth in claim 1, wherein the step of forming an aperture in said oxidation prevention film and a co-extensive recess in said oxidation buffer layer is carried out by means of a photolithographic etching process.

10. A method for forming a device isolation film of a semiconductor device, comprising the steps of:
   forming a pad oxide film on a semiconductor substrate;
   forming an oxidation buffer layer on said pad oxide film;
   forming a first oxidation prevention film on said oxidation buffer layer;
   heat-treating a first resultant structure obtained by the preceding steps;
   forming a second oxidation prevention film on said first oxidation prevention film;
   forming a longitudinally co-extensive aperture in said first and second oxidation prevention films; and,
   forming said device isolation film by subjecting a second resultant structure obtained by the preceding steps to a thermal oxidation process.

11. The method as set forth in claim 10, wherein said pad oxide film is formed to a thickness of 110–500 angstroms, and said oxidation buffer layer is formed to a thickness of 500–2,000 angstroms.

12. The method as set forth in claim 10, further comprising, after the step of forming an oxidation buffer layer, the step of nitrating a native oxide film formed on said oxidation buffer layer.

13. The method as set forth in claim 12, wherein the step of nitrating is carried out at a temperature of 850° C., using $NH_4$ gas.

14. The method as set forth in claim 10, wherein said oxidation buffer layer is formed of polysilicon.

15. The method as set forth in claim 10, wherein said first and second oxidation prevention films are formed of silicon nitride.

16. The method as set forth in claim 10, wherein said first oxidation prevention film is formed to a thickness of 100–500 angstroms, and the total thickness of said first and second oxidation prevention films is 1,000–3,000 angstroms.

17. The method as set forth in claim 16, wherein said first oxidation prevention film is formed to a thickness of about 200 angstroms.

18. The method as set forth in claim 10, wherein the step of heat-treating a first resultant structure is performed in a nitrogen atmosphere.

19. The method as set forth in claim 10, wherein the step of heat-treating a first resultant structure is performed at a temperature of 1,050° C.–1,150° C., for 1–4 hours.

20. The method as set forth in claim 19, wherein the step of heat-treating a first resultant structure is performed at a temperature of 1,150° C. for about eight hours.

* * * * *